United States Patent [19]
Quick

[11] Patent Number: 6,054,375
[45] Date of Patent: Apr. 25, 2000

[54] METHOD FOR MAKING LASER SYNTHESIZED CERAMIC ELECTRONIC DEVICES AND CIRCUITS

[76] Inventor: Nathaniel R. Quick, 894 Silverado Ct., Lake Mary, Fla. 32746

[21] Appl. No.: 09/088,046
[22] Filed: Jun. 1, 1998

Related U.S. Application Data

[63] Continuation-in-part of application No. 08/759,235, Dec. 5, 1996, Pat. No. 5,837,607.
[51] Int. Cl.[7] .............................. H01L 21/26; H01L 21/42
[52] U.S. Cl. ............................................. 438/535; 438/513
[58] Field of Search .................................... 438/535, 510, 438/513, 550, 542, 104, 931, 932, 960; 428/402, 409–410, 698–699, 701–704; 427/96, 126.2, 227, 555

[56] References Cited

U.S. PATENT DOCUMENTS

| | | | |
|---|---|---|---|
| 5,145,741 | 9/1992 | Quick | 428/402 |
| 5,391,841 | 2/1995 | Quick | 174/258 |
| 5,733,609 | 3/1998 | Wang | 427/561 |

*Primary Examiner*—Charles Bowers
*Assistant Examiner*—Craig Thompson
*Attorney, Agent, or Firm*—Clay Holland, Jr.

[57] ABSTRACT

Laser apparatus and methods are provided for synthesizing areas of ceramic substrates or thin films, such ceramics as Silicon Carbide and Aluminum Nitride, to produce electronic devices and circuits as integral electron circuit components thereof. Circuit components such as conductive tabs, interconnects, wiring patterns, resistors, capacitors, insulating layers and semiconductors are synthesized on the surfaces and within the body of such ceramics. Selected groupings and arrangements of these electronic circuit components within the substrates or thin films provide a wide range of circuits for applications such as digital logic elements and circuits, transistors, sensors for measurements and monitoring effects of chemical and/or physical reactions and interactions of materials, gases, devices or circuits that may utilize sensors. The electronic elements and components offer the advantages of providing thermal compatibilities with the substrate, since they are an integral part thereof and consequently are compatible therewith regarding thermal coefficients of expansion and thermal dissipation.

10 Claims, 3 Drawing Sheets

METHOD FOR MAKING LASER SYNTHESIZED CERAMIC ELECTRONIC DEVICES AND CIRCUITS

This is a CONTINUATION-IN-PART of application Ser. No. 08/759,235 filed Dec. 5, 1996, now U.S. Pat. No. 5,887,607 entitled LASER SYNTHESIZED CERAMIC ELECTRONIC DEVICES AND CIRCUITS (as Amended), Inventor Nathaniel R. Quick, which is still pending as of this filing.

The present invention relates to and is concerned with the creation of electronic devices and circuits as integral electronic circuitry that are synthesized on the surfaces and within the body of bulk and thin films of selected ceramic materials by means of laser writing and processing thereon with selected laser devices in an air and/or selected atmosphere.

BACKGROUND

Certain ceramics, such as Silicon carbide (SiC) Boron Nitride (BN) and Aluminum Nitride (AlN), are known to exhibit electrical properties ranging from insulating to semiconducting to conducting, as discussed in U.S. Pat. No. 5,145,741, issued Sep. 8, 1992, entitled "Converting Ceramic Materials to Electrical Conductors and Semiconductors", and U.S. Pat. No. 5,391,841, issued Feb. 21, 1995, entitled "Laser Processed Coatings on Electronic Circuit Substrates", both issued to Nathaniel R. Quick. The ceramics under consideration herein, are used to create devices such as conductive tabs, interconnects, vias, wiring patterns, resistors, capacitors, semiconductor devices and the like electronic components by laser synthesis on the surfaces and within the body of such ceramics to thereby eliminate photolithography processes which require numerous steps and generate undesirable chemical pollutants when processing such traditional electronic devices, components and circuitry.

As is well known Alumina ($Al_2O_3$) dominates the dielectric market as an integrating substrate or device carrier in electronics packaging. AlN, BN and SiC are also of interest, due to their Thermal Coefficient of Expansion (TCE) and for their dielectric constant and higher thermal conductivity than that of $Al_2O_3$. These properties are of substantial interest for new high temperature and aggressive environment applications, particularly where high integrated circuit packing densities are required. In the prior art, metallization methods, including dry-film imaging and screen printing have been used for the production of conductive patterns on Alumina, however, metal compatibility with the newer high thermal conductivity ceramic materials such as AlN, BN and SiC, have not been completely solved. Copper and silver paste exhibit a TCE mismatch aggravated by high temperatures and are subject to oxidation which increases their resistivity. In particular, bonding of copper to AlN has proved to be nontrivial. Alumina or stoichiometric aluminum oxynitride (AlON) coatings must be developed on the AlN surface through passivation processes. These passivation processes have poor reproducibility, especially when hot pressed AlN substrates are used. Thus, the direct laser synthesis of conductors in AlN, BN and SiC substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

SUMMARY OF THE INVENTION

The present invention provides for the use of selected ceramic materials, chemical doping of the ceramic materials, and use of laser synthesis processing techniques applied to selected areas of the ceramic body for creating electronic component devices individually and in an interconnected circuit arrangement on the surface of and/or within a substrate body of the ceramic material, such as for examples AlN, BN and SiC, whether the ceramic is thin film or bulk material. The invention uniquely utilizes the properties of the doped ceramic in combination with selected laser synthesis techniques to create a variety of electronic devices and components, such as capacitors; resistors; diodes; transistors; logic and digital devices; electrical conductors, connection tabs conductive holes or vias through substrates; and various types of sensors. More specifically, by selective chemically doping designated surface areas and layers of the ceramic substrate body or film with chemical elements, a ceramic is produced that may be readily converted in designated areas thereof by laser synthesis, using one of several laser devices, to create discrete electronic devices and electronic circuit arrangements. The creation of these various electronic devices and circuits takes place incrementally, such as making a (p-n)-type carrier semiconducting device by laser synthesizing two adjacent areas, one for the (p) and the other for the (n) portion. The required electrical conductive tab connections are laser synthesized on either side of the p-n junction, to thereby form a p-n junction diode. The formation of a simple (p-n-p) or (n-p-n) arrangement is accomplished by an added step in the above diode process by adding an additional (p) or (n) laser synthesized component, with the appropriate electrical conductor connections as noted above with respect to the diode example. Such elemental electronic devices are readily produced by simple laser synthesis without the traditional multiple step processing and attendant pollution and environmental contamination problems of the prior art processes.

BRIEF DESCRIPTION OF THE DRAWINGS

The present invention can be described in more detail and understood with the assistance of the accompanying drawings wherein.

Such processing techniques are well known in the prior art, but are used herein in accordance with the teachings of the invention to produce unique devices and circuitry utilizing fewer and simpler steps than required in the prior art and to eliminate many of the prior art contamination and environmental problems associated therewith.

DETAILED DESCRIPTION OF THE INVENTION

The present invention focuses on the processes and materials utilized to produce circuit components such as electronic elements, components, devices and circuit interconnection insitu on monolithic ceramic compound substrate or body or of a film thereof, deposited on a support substrate. These circuit components are formed by direct conversion of selected areas of the substrate or film by laser synthesis, producing conductor, semiconductor and insulative areas insitu thereon.

Figure 1:
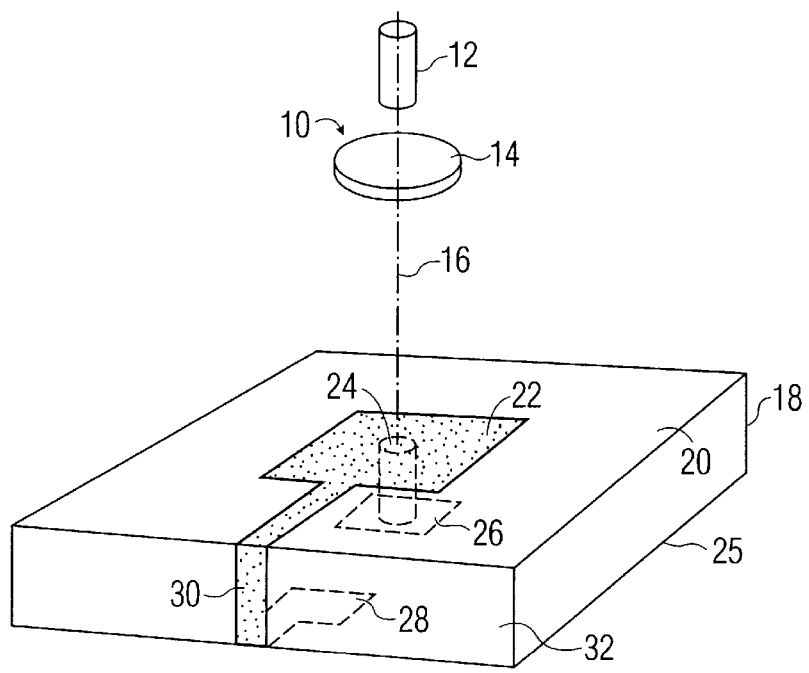
FIG. 1, shows an arrangement for practicing certain aspects of the invention, illustrating several electrical or electronic elements on a substrate that have been produced thereon by laser synthesis processing.

Referring now to the drawings, there is shown in FIG. 1, an arrangement for practicing the present invention, including a laser system 10 consisting of a laser device 12 and a laser beam focussing lens 14. A focussed laser beam 16 is shown impinging upon a monolithic substrate 18 of a crystalline or polycrystalline ceramic compound material having a rectangular configuration. The top surface of substrate 18 is designated by reference 20, and has an area 22 depicted thereon that has been converted to a semiconductor material by laser beam 16 with a small circular hole or via 24 intersecting therewith that extends through substrate 18 from semiconductor 22 by laser drilling and conversion, to a surface 25 on the reverse side of substrate 18 where it terminates in a conductive connection. The terminal ends and inner exposed surface of via 24 has been converted to an electroconductor material by laser beam 16 as it drills through substrate 18 between surface 22 and 25. On the reverse side of substrate 18 on surface 25 there is depicted an area on surface 25 that has been converted to an conductor pad 26 that is formed by laser beam 16, which is connected to conductor via 24, where it terminates at surface 25. A conductor pad 26 has been formed on surface 25 by rotating substrate 18 so that surface 25 is exposed to direct laser beam 16 interaction for direct conversion of pad 26 to a conductor material in accordance with the teachings of the present invention. Continuing with the description of FIG. 1, there is shown a conductor strip 30 connected to an edge of semiconductor area 22 on surface 20 and extending therefrom to the edge of substrate 18 and thence along a substrate surface 32 and thence along surface 25, terminating thereon with an electroconductor tab 28. Both conductors 30 and tab 28 have been produced by direct laser beam 16 conversion.

Figure 2:
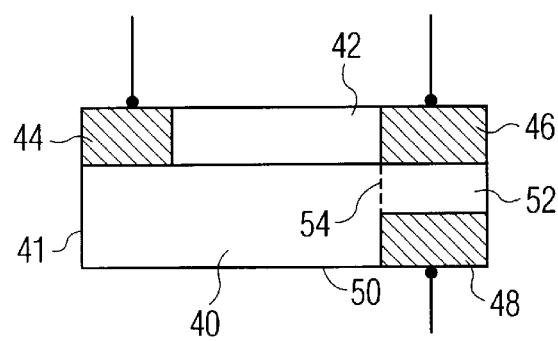
FIGS. 2–5, depict several arrangements of electronic components and elements produced on various substrates in accordance with the teachings of the present invention, illustrating how readily such elements may be disposed with respect to each other, to thereby create the various devices in accordance with the present inventive teachings.
Figure 3:
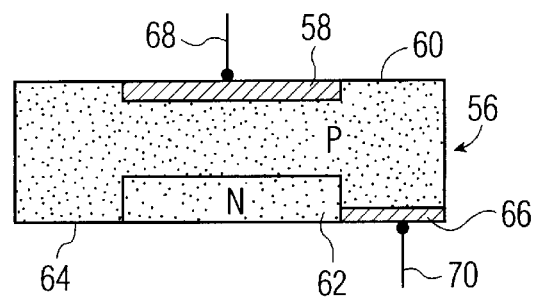
Figure 4:
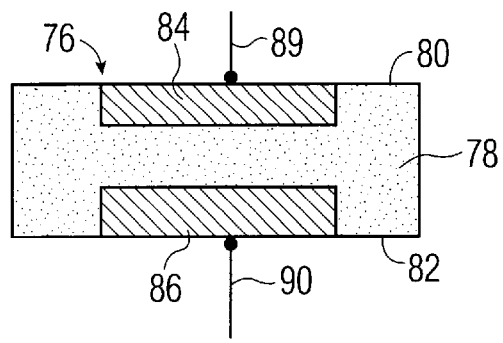

Referring now to FIGS. 2–4, there is shown a plurality of substrates that have had certain sections thereof converted directly into elements and components of electronic devices by laser beam synthesis in accordance with the teachings of the present invention. Shown in FIG. 2, is a monolithic substrate 41 of crystalline or polycrystalline ceramic compound material that is responsive to conversion by laser beam 16 exposure. More specifically, substrate 41 and a main body thereof may be a crystalline or polycrystalline ceramic compound material from the group including Aluminum Nitride (AlN), Silicon Carbide (SiC) or Boron Nitride (BN), for examples, as disclosed in U.S. Pat. No. 5,145,741, dated Sep. 8, 1992, issued to applicant, the foregoing materials are known to be convertible directly by laser beam inscription, from insulative to semiconductive to resistive and to conductive materials. However, applicant knows of no prior art that has utilized such technology to produce devices such as, sensors, diodes, transistors and circuitry containing such devices insitu on selected monolithic ceramic substrates as taught by the present invention. As can readily be appreciated the present invention provides simpler processes, with fewer processing steps, fewer pieces of processing equipment and a reduction, if not the elimination, of environmental pollants and contaminants heretofore associated with the prior art to produce such devices, as diodes, transistors, sensors and the like, as examples.

Referring again to FIG. 2, substrate body 40 is depicted as an insulative crystalline or polycrystalline ceramic compound material, such as AlN, SiC and BN, as examples. A resistor section 42 is formed on substrate body 40, having a resistive value in the range of $10^{-2}$–$10^{-6}$ ohm-cm, a pair of electrical conductors 44 and 46 are formed on substrate 40, disposed on opposite sides of and connected to resistor section 42, to thereby produce a resistor insitu on substrate body 40. Another electrical conductor 48 is formed on the reverse side 50 of substrate body 40. As shown a portion of substrate body 40, designated 52 and delineated by a broken line 52, is disposed between electrical conductors 46 and 48, to form a capacitor.

Referring now to FIG. 3, there is shown a crystalline or polycrystalline ceramic compound substrate 56, of SiC, chemically doped with aluminum (Al) forming a p-type carrier (electron holes) semiconductor material. By laser beam synthesis, conductor 58 is formed on a surface 60 of substrate 56, and an n-type carrier (electrons) semiconductor 62 is formed at a surface 64 of substrate 56 by laser beam chemical doping with phosphorus (P), and an electroconductor 66 is formed on a reverse side 64 of substrate 56 and is electrically connected to n-type carrier 62.

The foregoing formed device is capable of operating as a diode in an external circuit by connecting conductors 58 and 66 to external leads 68 and 70, respectively, or as a insitu diode when connected to other components which may be formed on substrate 56 and connected to terminals 58 and 66.

Referring to FIG. 4, there is shown a device 76, that may operate as various types of sensors, such as thermoresistive, piezoresistive or chemoresistive, depending the electroresistive properties of a ceramic compound substrate body 78. There are reverse surfaces 80 and 82 on substrate body 78, that have conductors 84 and 86 formed on surfaces 80 and 82, respectively, to which external conductor terminals 88 and 90 respectively are provided for external connections.

It should be noted that devices of the type shown in FIG. 4, operate primarily on the principal of change in resisitivty (ohm-cm) of the laser beam synthesized ceramic, and therefore, are uniquely adaptable to hostile environmental operations, such as with automobile and aircraft engines that are made of ceramic components. As examples, the temperature, physical changes or distortion and the presence of chemicals occurring in or near an engine, can be monitored at selected sections of the engines by depositing a film of crystalline or polycrystalline ceramic compound, directly onto the engine body at selected sections and subsequently laser beam synthesizing such films to produce a thermoresistive, piezoresistive or chemoresistive device from the deposited films. Alternately, the surface of ceramic engine components comprised of may be made of AlN, SiC or BN can be directly converted to these types of sensors. Also there are situations where the engine may have a component part made of ceramic, and it may be desirable to monitor such component and therefore, the sensors of the present invention may be disposed thereon and used to monitor such components. Such devices would consist of resistive areas disposed between a pair of laser synthesized electroconductor tabs, where the tabs are used for external connections. It has been experimentally determined that crystalline or polycrystalline ceramic compounds, such as (AlN), (SiC) and (BN), may be deposited upon ceramic materials of which automotive and aircraft engines are made, by means of known vapor or thermal spray deposition techniques, without debonding therebetween when operating at elevated temperatures of such engines. Thus, such selectively disposed devices can be used for remote monitoring of the changes in the engines readily and simply on a real time basis, when compared with the prior art techniques. It should be noted that these sensor devices may be characterized as passive or active devices, that is, when an electrical bias is applied the device they are active and without the bias they are passive.

Figure 5:
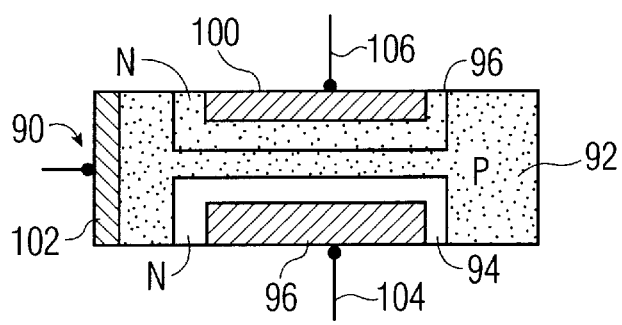

The device depicted in FIG. 5, illustrates one of several arrangements for elements for a transistor type device. There is shown a crystalline or polycrystalline ceramic substrate 90 of p-type carrier material designated 92 that has a n-type carrier section laser beam synthesized on reverse sides of the substrate designated 94 and 96. Over of these n-type carriers are conductors 98 and 100, respectively formed by laser synthesis on each layer of n-type carrier sections 94 and 96. On a surface of substrate section 92 there is formed by laser synthesis a conductor 102. Conductors 98 and 100 each have terminal conductors 104 and 106, respectively connected thereto for external connections. The device just described may be utilized as a traditional transistor connected to external circuits or as an insitu device on a monolithic substrate as part of a circuit thereon.

Figure 6:
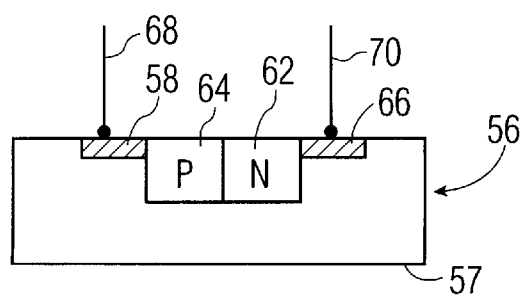
FIG. 6, depicts a p-n junction device produced in a substrate body or film with appropriate electrical conductive leads, such device may be used as a diode.

In FIG. 6, there is shown an alternate arrangement for a diode, similar to that shown in FIG. 3 where a substrate body 57 is a crystalline or polycrystalline ceramic material that is responsive to laser conversion and it has had p-type carrier and n-type carrier adjacent sections formed thereon by laser synthesis This arrangement is the traditional configuration for junction diodes known in the prior art, and may be part of an external circuit or as a device of an insitu circuit that may be formed on a monolithic substrate in accordance with of the present invention.

Figure 7:
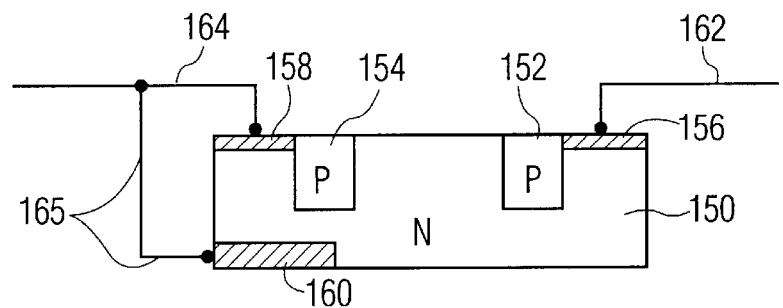
FIG. 7, depicts an n-p-n transistor device produced in accordance with the present invention.

Referring to FIG. 7, there is shown a (p-n-p)-type transistor having a configuration different from the (n-p-n)-type transistor shown in FIG. 5. As shown there is depicted a n-type substrate 150 with two p-type carrier sections 152 and 154 separated from one another, each p-type sections has a conductor 162 and 164 connected, respectively thereto and an conductor 160 disposed on a reverse surface of substrate 150. A conductor 162 is connected to conductor 156 that function as a drain terminal of the device, while a conductor 164 is connected to conductor 158 that function as a source terminal of the device. A conductor 166 is attached to conductor 160 that is also connected to conductor 164 the source terminal The resultant device is characterized as a traditional (p-n-p)-type transistor.

Figure 8:
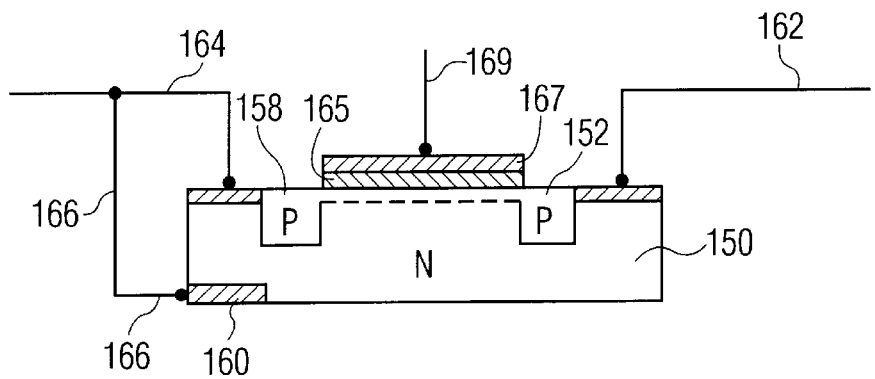
FIG. 8, depicts an n-channel transistor that is produced in accordance with the teachings of the present invention, illustrating the versatility and uniqueness of the invention.

FIG. 8, shows a device similar to the device shown in FIG. 7, with the addition of a dielectric layer 165 formed on the surface of substrate 150 and disposed between p-type carriers 152 and 158. Deposited on top of dielectric layer 165 is a conductor layer 167 to which a conductive lead 169 is attached for external connections as a gate terminal for the device. The resulting device is characterized as a n-type carrier channel transistor.

Figure 9:
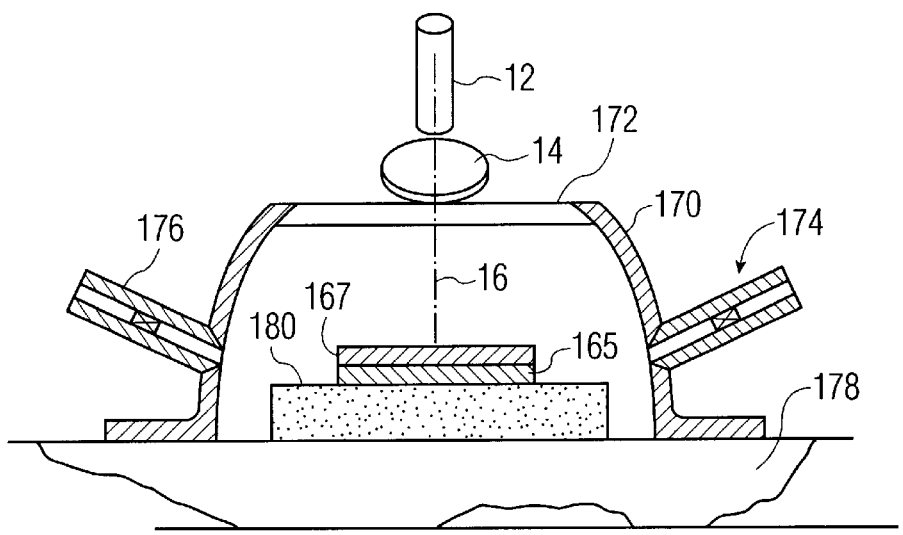
FIG. 9, depicts an air-tight chamber and laser arrangement utilized to perform certain processing steps in accordance with the invention, for producing chemical doping of entire selected ceramic substrate bodies or films and or selected areas thereof; and for selective dielectric and/or conductive coatings.

Referring now to FIG. 9, there is shown a processing arrangement including laser 12, focussing lens 14 and laser focused beam 16, such as that shown in FIG. 1 and it operates in a similar manner. Also shown is a chamber 170, including an airtight laser beam transmission window 172 disposed for transmitting beam 16 therethrough into the chamber. Chamber 170 has an inlet and valve combination 174 and outlet and valve combination 176 connected to the side wall of the chamber, for injecting and removing gases into and therefrom, respectively. The chamber is dispose on a support member 178 forming an airtight seal therewith. Also shown in FIG. 9, there is a substrate 180 upon which a dielectric layer 165 is formed and a conductive layer 167 is deposited on top of dielectric layer 165. Substrate 180 is a material such as substrate 150 shown in FIGS. 7 and 8. The arrangement shown in FIG. 9, is used to convert or add to the surface of substrates placed therein. As shown, dielectric layer 165 and conductor 167 are of the type shown in FIG. 8 so as to complete the formation of an n-type carrier channel transistor.

EXAMPLE

To accomplish the unique results derived from the teachings of the present invention, it is necessary to consider some of the detail processing steps and procedures thereof. In various sections of the disclosure and claims the phrases "laser synthesis" and "laser synthesized" have been used to broadly mean or define, the use of a selected laser beam impinging (inscribing or writing or drilling) onto or into the body of a crystalline or polycrystalline substrate or body to thereby cause rapid thermal heating for melting and the rapid cooling for solidification in selected exposed areas, causing chemical and physical changes to occur to the substrate areas exposed to the laser beam. Such exposure to the laser beam may be accompanied by the use of gases, such as air, oxygen or other gas/vapor mixtures, that may be a co-operant in the process for causing such changes. Use of these phrases is consistent with the teachings of U.S. Pat. Nos. 5,145,741 and 5,391,841, noted herein and both issued to applicant.

Continuing with the disclosure of the present invention, attention is directed to the various laser devices used to perform laser synthesis as envisioned herein. The Table I entitled "Typical Laser Types", setforth below, list three (3) laser types which have been found satisfactory for practicing the present invention. A second Table II entitled "Laser Processing Parameters", shown below discloses eight (8) parameters for each of the three (3), sample laser types, namely, Nd:YAG, Frequency Double Nd:YAG and Excimer lasers, that are useful for laser synthesis processes. These lasers are capable of laser synthesis and/or conversion of insulating and semiconducting crystalline or polycrystalline ceramics and to material combinations necessary to fabricate and produce the various electronic devices and circuits taught by the invention.

The parameters shown have been diligently arrived at after extensive test and evaluation, and have been selectively used to produce the various devices and circuits in accordance with the teachings of the present invention and claims.

TABLE I

Typical Laser Types

| Laser Types Nd:YAG | SiC Untreated Resistivity Ohm-cm | SiC Converted Resistivity Ohm-cm |
|---|---|---|
| Wavelength: 1064 nm | $10^{11}$ | $5.1 \times 10^{-3}$ |
| Excimer |  |  |
| Wavelength: 248 nm | $10^{11}$ | $1.2 \times 10^{-3}$ |
| Frequecy Double Nd:YAG Wavelength: 532 nm | $10^{11}$ | $1.9 \times 10^{-3}$ |

TABLE II

Laser Processing Parameters

| Laser Type | Pulse energy (J) | Beam Diameter (cm) | Energy density (J/cm$^2$) | Pulse Duration (nsec) |
|---|---|---|---|---|
| Nd:YAG 1064 nm | 0.0081 | 0.025 | 12.5 | 70 |
| KrF Excimer 248 nm | 0.0034 | 0.085 | 2.2 | 30 |
| Nd:YAG 532 nm | 0.0011 | 0.002 | 339.5 | 100 |

| | Peak Pulse Intensity (W/cm) | Scan Velocity (cm/sec) | Passes | Conversion Energy (J/cm$^3$) |
|---|---|---|---|---|
| Nd:YAG 1064 nm | $1.8 \times 10^8$ | 0.3 | 2 | $1.2 \times 10^9$ |
| KrF Excimer 248 nm | $7.3 \times 10^7$ | 0.053 | 1 | $1.4 \times 10^9$ |
| Nd:YAG 532 nm | $3.4 \times 10^9$ | 2 | 1 | $1.67 \times 10^9$ |
| | | 2 | 2 | $3.35 \times 10^9$ |
| | | 40 | 1 | $8.35 \times 10^7$ |
| | | 40 | 2 | $1.67 \times 10^8$ |

The ceramic materials taught by the present invention may be of a crystalline or polycrystalline structure and are representative of several hundred possible types from which to choose. For example, Silicon Carbide, in the Beta-SiC( Zincblende structure) or 6H-SiC (6 bilayers along the hexagonal crystal direction) are only two of many types of material structures SiC can have as a convertible ceramic. Similarly, many structural types exist for laser convertibility, including SiC, AlN and BN which have been the focus of the disclosure and teaching in accordance with the present invention. However, it is understood that these ceramics, may be considered preferred among others which may be selected As can be appreciated by those skilled in this art, the practice of the present invention is strongly influenced by a working knowledge of material science and the unique properties of crystalline or polycrystalline ceramic materials known in the field of such science. Consequently, teachings herein are directed toward known factors derived from extensive experimental and proven results within such science.

Continuing, the selected ceramics, as examples, namely, SiC, AlN and BN have been used to readily change their initial electrical properties by "chemical doping" as by means of laser synthesis or conversion. For example, doping of Beta-SiC ceramic material with phosphorous generates n-type carrier (electrons), and with aluminum generates p-type carrier (holes) semiconductive materials. Shown herein below is Table III entitled "Dopants and Materials Generated by Laser Synthesis". As shown in Table III, materials such as, SiC and AlN as examples, may be laser synthesized with dopants, as examples, shown to produce the resultant materials. As shown, the dopants may be in the form of gases, and the chemical doping therefrom may be accomplished by the use of a system arrangement illustrated in FIG. 9 hereof. The process for doping within chamber 70 of FIG. 9, occurs by laser beam 16 illuminating the selected areas of a substrate body by inscribing or writing thereon, while simultaneously causing a gas therein to chemically disassociate and diffuse into the laser exposed areas of the substrate body to thereby cause chemical, electrical and physical changes in the properties of the substrate body where the laser has selectively scribed.

TABLE III

DOPANTS AND MATERIALS GENERATED BY LASER SYNTHESIS

| DOPANT SOURCE | DOPANT | RESULTANT MATERIALS (No Oxygen Present) | RESULTANT MATERIALS (No Oxygen Present) |
|---|---|---|---|
| Di-Borane | Boron | Aluminum Nitride Boron Boron Nitride (s) Aluminum Boride | Silicon Carbide Boron (p-type) Boron Carbide (i) |
| Silane | Silicon | Silicon(s) Silicon Nitride (i) | Silicon(s) Silicon carbides(s) |
| Phosphine | Phosphorous | Phosphorous Aluminum-Phosphide(s) | Phosphorous (n-type) Boron |
| Titanium tetra chloride Titanium ethoxide | Titanium | Titanium (c) Titanium nitride (c) Titanium-Aluminide (c) | Titanium (s) Titanium Silicide(s) Titanium Carbide(s) |
| Aluminum sec-butoxide | Aluminum | Aluminum Aluminum Nitride(s) | Aluminum (p-type) Aluminum Carbide |
| Tetra carbonyl Nickel | Nickel | Nickel Nickel Aluminide (c) | Nickel (c) Nickel Carbide Nickel Silicide |
| Tungsten hexafluoride | Tungsten | Tungsten Tungsten Nitride | Tungsten(c) Tungsten-Carbide (c) Tungsten |
| Nitrogen | Nitrogen | Nitrogen (n-type) | Nitrogen |

The dopants and resultant materials shown in Table III are illustrative of many combinations which could be selected within the scope of the teachings of the present invention.

From the foregoing discussions of Tables I–III, it can readily be appreciated that devices and circuits of the type taught and claimed herein can be produced by the appropriate selection of crystalline or polycrystalline ceramic material; selection of an appropriate type of laser; operating the laser with appropriate parameters; and using appropriate dopants.

Until now, the disclosure primarily has discussed the formation of the devices and circuits on substrate bodies, suggesting that the substrates are in a non-film structure. However, it is understood that the substrates envisioned by the invention includes film structures of appropriate thickness to accommodate the formation of the devices and circuits in accordance with the teachings hereof. More particularly, the substrates 44, 56, 75, 90 and 150 depicted in the various figures may be substrate films. Various crystalline or polycrystalline ceramic materials having properties substantially identical as those of substrates 44, 56, 76, 90 and 150, and others may be readily formed on a support or carrier substrate through the use of a laser synthesis and chamber depicted in FIG. 9, for example, by means of known vapor deposition techniques.

Once a layer of film has been formed on a support substrate it may be processed in a similar manner as the substrates depicted in FIGS. 1–8, in accordance with the teachings of the invention to produce devices and integrated circuits. Successive film layers may be formed and processed to produce a multi-layer structure, that represents a unique feature for using films, to create a three dimensional structure. Conductive interconnections between selected layers, devices and circuits may be made by use of conductive vias such a via 24 depicted in and discussed in connection with FIG. 1

The present disclosure has herein above emphasized the electrical properties of various devices, components and circuits that may be produced, however, it should be noted that another equally important and unique property or feature of the electrical conductive tab, pads, vias and interconnection wiring leads, that they are all connectable to or bondable to traditional external electrical circuits by means of molten metals or metal alloys to which they are readily bonded More specifically, the various electrical conductive tabs, pads, vias, and interconnection wiring leads, whether on a bulk or film material substrate may be brazed or soldered to external electrical conductors by use of suitable molten metals and metal alloys. The metal bonding features and properties of the tabs, pads, vias and wiring leads or conductors are produced as a result of direct laser scribing, writing etc. as taught by the present invention. Since this bondable feature of these laser inscribed electrical conductors are an integral part of the ceramic substrate, the molten bonding may be performed at higher than traditional brazing or soldering temperatures to thereby produce high temperature bonding. This higher bonding temperature will enable the components devices and circuits etc. to operate at higher temperatures without debonding. In addition, since these devices are an insitu part of the substrate that support them, heat is more readily dissipated therefrom owing to the better dielectric constants and higher thermal conductivity of the ceramics of the present invention than those of $Al_2O_3$ or other prior art substrates.

The foregoing disclosure and teachings of the present invention readily and adequately demonstrate that direct laser synthesis and chemical process doping of selected ceramic substrate and film materials, can be utilized to create and produce electronic devices and circuits uniquely within the body of such ceramic materials and in which the Thermal Coefficient of Expansion (TCE) between the devices and circuits are compatible with the substrate of films owing to their inherent relationship as part of the starting material and noting that nothing during the processing of the system has changed their inherent compatibility with respect to TCE between the substrate and the circuits and devices formed thereon. In addition to the enhanced TCE properties, the present invention provides electron devices and circuit arrangements within the selected ceramic materials that have better dielectric constant and higher thermal conductivity properties than those of $Al_2O_3$ which is traditionally used as support substrates for electronic devices and circuits of the type addressed by the present invention.

It is to be understood that the above described embodiments and teachings of the present invention are only illustrative of the principles applicable. Various other arrangements and processing modifications may be envisioned or refined by those skilled in the art without departing from the spirit and scope of the invention. For example, other ceramic materials of hexagonal crystalline structure with certain nitride or carbide compounds, may be adapted to have similar or equivalent processing properties as disclosed herein, and it is inferred that like electrical semiconductive, conductive and insulative properties may be attainable within the spirit and scope of the present invention. Consequently, it is understood that the present invention is limited only by the spirit and scope of the disclosure and appended claims.

What is claimed as new is:

1. A method for making a transistor device by laser synthesis directly onto a monolithic substrate of essentially a crystalline or polycrystalline ceramic compound, said method comprising, the steps of:

a. providing a monolithic ceramic compound substrate having a reverse side and of essentially n-type semiconductive carriers responsive to laser synthesis conversion;

b. converting a first section of said substrate to a p-type semiconductive carrier by laser synthesis;

c. converting a second section of said substrate to a p-type semiconductive carrier by laser synthesis spaced apart from said first p-type carrier section, to thereby form a separation therebetween;

d. inscribing on said substrate by laser synthesis a first conductor connected to said first p-type section and a second conductor connected to said second p-type section, to provide electrical connections to said p-type sections on said substrate; and e. inscribing on said reverse side of said substrate a third conductor, said conductors providing means for connecting said device to other and external components, elements and circuits, and to thereby provide a p-n-p type semiconductor transistor.

2. A method for making a transistor device of claim 1, which includes the steps of placing said p-n-p transistor in a hermetically sealed chamber having a laser beam transmission window therein, and forming a first dielectric layer on a surface of said substrate disposed between said spaced apart p-type carrier sections and a second conductor layer on top of said dielectric layer by means of laser synthesis and various selected metallo-organic gases introduced into said chamber, and said laser beam is directed into said chamber through said chamber window for producing said dielectric and conductor layers on said device, to thereby produce a (p-n-p)-type channel transistor.

3. A method for making a transistor device of claim 2, in which said laser is of a type selected from the group consisting of Nd:YAG, frequency doubled Nd:YAG or Excimer lasers, said substrate is a ceramic compound of a material selected from the group consisting of Aluminum Nitride, Silicon Carbide or Boron Nitride and said gases are selected from the group consisting of phosphate gas, di-borane gas, tungsten hexafloride gas, titanium tetra chloride gas, titanium ethoxide gas, aluminum sec-butoxide gas silane gas and tetra carbonyl nickel gas.

4. A method for making a plurality of electrical components and elements individually or in a circuit arrangement on a film essentially of a crystalline or polycrystalline ceramic compound in a metallo-organic containing atmosphere, said method comprising, the steps of:

a. providing a vapor deposition chamber and system for depositing selected films on a support substrate contained therein;

b. depositing a film of a crystalline or polycrystalline ceramic on a support substrate contained in said chamber by vapor deposition techniques;

c. providing a plurality of metallo-organic dopants containing gas/vapor for use in said chamber at selected processing steps to thereby cause chemical changes in selected areas of said film; and d. directing a focused laser beam onto a surface portion of said film disposed in said chamber and causing relative motion between said beam and film so as to laser synthesize a plurality of electronic devices, circuit elements and interconnecting wiring leads thereon to thereby form circuits on said substrate.

5. A method of claim 4, in which said components and elements include a plurality of devices such as electronic sensors, diodes, transistors and conductors.

6. A method of claim 4, in which said laser is of a type selected from the group consisting of Nd:YAG, frequency doubled Nd:YAG or Excimer lasers, and said film is a ceramic compound of a material selected from the group consisting of Aluminum Nitride, Silicon Carbide or Boron Nitride.

7. A method of claim 4, in which said metallo-organic dopants are selected from the group including di-borane, silane, phosphine, titanium tetra chloride, titanium ethoxide, aluminum sec-butoxide, tetra carbonyl, tungsten hexafluride and nitrogen.

8. A method of claim 4, in which successive film layers are stacked on one another each having devices and circuitry formed on each layer to produce a multi-layer three dimension integrated circuit structure.

9. A method of claim 4, in which said conductors inscribed on said substrate may be connected to electrical conductors external to said substrate by means of molten metal or molten metal alloys for bonding.

10. A method of claim 4, in which said conductors inscribed on said substrate may be electrically conductive pads, tabs, vias and interconnecting wiring leads.

\* \* \* \* \*